United States Patent
Hamilton et al.

(10) Patent No.: US 10,505,345 B2
(45) Date of Patent: Dec. 10, 2019

(54) MODE-LOCKING SEMICONDUCTOR DISK LASER (SDL)

(71) Applicant: SOLUS TECHNOLOGIES LIMITED, Glasgow, Central Scotland (GB)

(72) Inventors: Craig James Hamilton, Strathclyde (GB); Graeme Peter Alexander Malcolm, Strathclyde (GB)

(73) Assignee: Solus Technologies Limited, Glasgow (GB)

(*) Notice: Subject to any disclaimer, the term of this patent is extended or adjusted under 35 U.S.C. 154(b) by 0 days.

(21) Appl. No.: 15/032,405

(22) PCT Filed: Oct. 29, 2014

(86) PCT No.: PCT/GB2014/053214
§ 371 (c)(1),
(2) Date: Apr. 27, 2016

(87) PCT Pub. No.: WO2015/063478
PCT Pub. Date: May 7, 2015

(65) Prior Publication Data
US 2016/0254645 A1 Sep. 1, 2016

(30) Foreign Application Priority Data
Oct. 29, 2013 (GB) .................................. 1319100.2

(51) Int. Cl.
*H01S 5/065* (2006.01)
*H01S 5/14* (2006.01)
(Continued)

(52) U.S. Cl.
CPC .......... *H01S 5/0657* (2013.01); *H01S 3/1118* (2013.01); *H01S 5/12* (2013.01);
(Continued)

(58) Field of Classification Search
CPC ...... H01S 3/1118; H01S 5/1221; H01S 5/141; H01S 3/105; H01S 3/139; H01S 5/0287–0288; H01S 5/0657
See application file for complete search history.

(56) References Cited

U.S. PATENT DOCUMENTS 5,079,772 A    1/1992  Negus et al.
5,627,854 A *  5/1997  Knox .................... B82Y 20/00
                                                    372/18
(Continued)

FOREIGN PATENT DOCUMENTS

GB    2493583 A    2/2013
GB    2500676 A   10/2013
(Continued)

OTHER PUBLICATIONS

Saas et al., "Exciton resonance tuning for the generation of subpicosecond pulses from a mode-locked semiconductor disk laser," Applied Physics Letters, 89/141107 (2006).
(Continued)

Primary Examiner — Xinning(Tom) Niu
Assistant Examiner — Sean P Hagan
(74) Attorney, Agent, or Firm — FisherBroyles, LLP (57) ABSTRACT

A mode locking semiconductor disk laser (SDL) comprising a resonator terminated by first and second mirrors and folded by a third mirror is presented. The third mirror includes a semiconductor disk laser (SDL) suitable for generating a resonator field having a predetermined central wavelength $\lambda_o$, while the second mirror includes an intensity saturable mirror suitable for mode locking the resonator field at the predetermined wavelength. The central wavelength of the reflectivity profile of the first and or second mirrors is shifted to a wavelength shorter than the central wavelength $\lambda_o$ to suppress gain at wavelengths longer than the central wavelength $\lambda_o$. By mismatching the reflectivity profile of the first
(Continued)

and or second mirrors to that of the desired output wavelength provides a stable mode locked laser with significantly reduced noise.

26 Claims, 6 Drawing Sheets

(51) Int. Cl.
    *H01S 5/183*     (2006.01)
    *H01S 5/12*     (2006.01)
    *H01S 5/125*     (2006.01)
    *H01S 3/08*     (2006.01)
    *H01S 5/024*     (2006.01)
    *H01S 5/04*     (2006.01)
    *H01S 3/11*     (2006.01)
    *H01S 3/081*     (2006.01)
    *H01S 3/0941*     (2006.01)

(52) U.S. Cl.
    CPC .............. *H01S 5/125* (2013.01); *H01S 5/141* (2013.01); *H01S 5/18383* (2013.01); *H01S 3/0813* (2013.01); *H01S 3/08059* (2013.01); *H01S 3/09415* (2013.01); *H01S 5/02484* (2013.01); *H01S 5/041* (2013.01); *H01S 5/1221* (2013.01); *H01S 2301/02* (2013.01)

(56) References Cited

U.S. PATENT DOCUMENTS

| | | | |
|---|---|---|---|
| 5,966,390 | A | 10/1999 | Stingl et al. |
| 6,097,741 | A * | 8/2000 | Lin .................. H01S 3/067 372/6 |
| 6,735,234 | B1 * | 5/2004 | Paschotta .............. H01S 5/141 372/10 |
| 6,834,064 | B1 | 12/2004 | Paschotta et al. |
| 9,318,867 | B2 | 4/2016 | Pronin et al. |
| 2002/0085608 | A1 | 7/2002 | Kopf et al. |
| 2003/0039025 | A1* | 2/2003 | Mugino .................. H01S 5/12 359/334 |
| 2004/0095634 | A1 | 5/2004 | Paschotta et al. |
| 2004/0125831 | A1* | 7/2004 | Fischer .................. H01S 5/028 372/20 |
| 2004/0190567 | A1 | 9/2004 | Lutgen et al. |
| 2007/0098031 | A1 | 5/2007 | Yang et al. |
| 2007/0223540 | A1 | 9/2007 | Sudmeyer et al. |
| 2008/0013587 | A1 | 1/2008 | Tempea et al. |
| 2008/0043798 | A1 | 2/2008 | Calvez et al. |
| 2009/0290606 | A1 | 11/2009 | Chilla et al. |
| 2010/0303121 | A1 | 12/2010 | Alalusi et al. |
| 2011/0150013 | A1 | 6/2011 | Spinelli et al. |
| 2011/0292954 | A1 | 12/2011 | Stoev et al. |
| 2012/0093179 | A1 | 4/2012 | Dunn et al. |
| 2012/0200912 | A1 | 8/2012 | Hodgson et al. |
| 2013/0064262 | A1 | 3/2013 | Kopf |
| 2014/0286364 | A1 | 9/2014 | Pronin et al. |
| 2015/0063389 | A1 | 3/2015 | Hamilton et al. |
| 2016/0254645 | A1 | 9/2016 | Hamilton et al. |

FOREIGN PATENT DOCUMENTS

| | | |
|---|---|---|
| WO | WO 01/59895 A1 | 8/2001 |
| WO | WO 2007/053336 A1 | 5/2007 |
| WO | WO 2011/084467 A1 | 7/2011 |
| WO | WO 2013/003239 A1 | 1/2013 |
| WO | WO 2013/144619 A1 | 10/2013 |
| WO | WO 2013/144620 A1 | 10/2013 |
| WO | WO 2015/087072 A1 | 6/2015 |

OTHER PUBLICATIONS

Zhao et al., "Subpicosecond pulse generation from a 1.56 μm mode-locked VECSEL," Optics Letters, vol. 36, No. 22, Nov. 15, 2011, pp. 4377-4379. (XP001570805).
Dec. 3, 2015 Office Action issued in U.S. Appl. No. 14/389,212.
Feb. 18, 2015 Office Action issued in U.S. Appl. No. 14/389,212.
Härkonen et al., "Modelocked GaSb Disk Laser Producing 384 fs Pulses at μm Wavelength," Electronic Letters, vol. 47, No. 7, Jan. 1, 2011, p. 454 (XP055070624).
Hayduk, "Passively Mode-Locked Erbium-Doped Fiber Lasers Using Multiple Quantum Well Saturable Absorbers," Mar. 1998, Air Force Research Laboratory, pp. 1-133.
Jul. 20, 2016 Notice of Allowance issued in U.S. Appl. No. 14/389,247.
Jun. 24, 2016 Office Action issued in U.S. Appl. No. 14/389,212.
Keller et al., "Passively Modelocked Surface-Emitting Semiconductor Lasers," Physics Reports, vol. 429, No. 2, Jun. 1, 2006, pp. 67-120 (XP024926285).
Kornaszewski et al., "SESAM-Free Mode-Locked Semiconductor Disk Laser," Laser & Photonics Reviews, vol. 6, No. 6, Aug. 27, 2012, pp. 23-23 (XP055070226).
Mar. 16, 2015 Office Action issued in U.S. Appl. No. 14/389,247.
Oct. 21, 2015 Office Action issued in U.S. Appl. No. 14/389,247.
Pronin et al., "High-power 200 fs Kerr-lens mode-locked Yb:YAG thin-disk oscillator," Optics Letter, Optical Society of America, vol. 36, No. 24, Dec. 15, 2011, pp. 4746-4748 (XP001571558).
Saarinen et al., "Power-Scalable 157 μm Mode-Locked Semiconductor Disk Laser Using Wafer Fusion," Optics Letters, vol. 34, No. 20, Oct. 7, 2009, p. 3139 (XP055070616).
Trooper et al., "Topical Review: Vertical-external-cavity semiconductor lasers," Journal of Physics D: Applied Physics, vol. 37, No. 9, May 7, 2004, pp. R75-R85.
Oct. 6, 2017 Office Action issued in U.S. Appl. No. 15/103,358.
Rattunde et al., 'III-Sb-based Type-I QW Diode Lasers.' Mid-infrared Semiconductor Optoelectronics. Eds. Anthony Krier. Springer Series in Optical Sciences, vol. 118, London: Springer, 2006, pp. 140-142 (ISBN: 184628208X).
Svelto, "Principles of Lasers," 2010, Springer 5th Edition, pp. 1-620.
Sieber et al., "Femtosecond VECSEL with tunable multi-gigahertz repetition rate," Optics Express, vol. 19, No. 23, Published Nov. 3, 2011.

* cited by examiner

_Fig. 5_

MODE-LOCKING SEMICONDUCTOR DISK LASER (SDL)

This application is the U.S. national phase of International Application No. PCT/GB2014/053214 filed 29 Oct. 2014 which designated the U.S. and claims priority to GB Patent Application No. 1319100.2 filed 29 Oct. 2013, the entire contents of each of which are hereby incorporated by reference.

The present invention relates to the field of semiconductor lasers and in particular to a semiconductor disc laser (SDL) configured to emit ultra short pulses of radiation.

It is noted that SDLs are also known in the art as Vertical External Cavity Emitting Lasers (VECSELs) or Optically Pumped Semiconductor Lasers (OPSLs). Therefore the term semiconductor disc laser (SDL) when used throughout the present description is used to refer to each of these systems.

The term "ultra short" pulses as used within the following description refers to pulses having a duration from about 100 picoseconds (ps) down to a few femtoseconds (fs).

A well-known technique for generating short or ultra short pulse generation is mode locking. When mode locking takes place in a laser resonator a plurality of modes of the laser resonator are coupled in a phase-locked manner in such a way that the resulting generated electromagnetic field comprises a short pulse which circulates within the resonator. It can be induced by a temporal loss modulation which reduces the intracavity losses for a pulse within each cavity roundtrip time. This results in an open net gain window, in which pulses only experience gain if they pass the modulator within a particular time window.

The loss modulation can be formed either actively or passively. Active mode locking is achieved, for instance, using an acousto-optic modulator as an intracavity element, which is synchronized to the cavity roundtrip time. However, ultra short pulse generation relies on passive mode-locking techniques, because only a passive shutter is fast enough to shape and stabilise ultra short pulses. Passive mode locking generally relies on a saturable absorber mechanism, which produces decreasing loss with increasing optical intensity. When the saturable absorber parameters are correctly adjusted for the laser system, stable and self-starting mode locking can be achieved.

It is known in the art to employ a saturable Bragg reflector (SBR) to passively mode lock a solid state laser, see for example Tsuda et al "Mode-Locking Ultrafast Solid-State Lasers with Saturable Bragg Reflectors", IEEE Journal of Selected Topics in Quantum Electronics Vol. 2, No. 3, September 1996 pp. 454-463 and U.S. Pat. No. 5,627,854. An SBR is a nonlinear mirror that comprises one or more semiconductor quantum wells within a standard distributed Bragg reflector (DBR) i.e. a stack of alternating layers of quarter wave semiconductor materials. As a result, the reflectivity exhibited by an SBR is higher at higher light intensities. Self-starting femtosecond mode locking of resonators containing Ti:sapphire or Cr:LiCAF solid state gain mediums have been demonstrated.

US patent publication number 2004/0190567 discloses extending the above concepts so as to mode lock an SDL by incorporating a saturable Bragg reflector (SBR) within the resonator. The SDL comprises its own distributed Bragg reflector (DBR), mounted on which is a semiconductor gain medium e.g. materials such as InGaAlP, InAlGaN, AlGaAs, InGaAsP, GaAsN, InGaAsN, GaSb and InP.

The methodology employed in the art to design a system as described in US patent publication number 2004/0190567 will now be briefly described with reference to FIG. 1. When designing the SDL a critical design factor is the central wavelength $\lambda_0$ at which the laser is desired to operate e.g. $\lambda_0$=980 nm.

The distributed Bragg reflector (DBR) of the SDL is then designed so as to be reflective at the central wavelength $\lambda_0$. Typically, a distributed Bragg reflectors (DBR) can be designed to exhibit a reflectivity values greater than 99.9% at a desired wavelength. This is achieved by providing alternating quarter-wave layers upon a substrate e.g. interspersed layers of AlAs and GaAs deposited upon a GaAs substrate. It is the optical thickness of the alternating quarter-wave layers which defines the central reflectivity value of the distributed Bragg reflector (DBR) while the number of layers determines the overall profile 1, and hence the reflectivity bandwidth $\Delta R$ of the distributed Bragg reflector (DBR).

The next stage involves the design of the gain medium. This is achieved by providing half-wave layers e.g. GaAs structures upon the previously described distributed Bragg reflector (DBR) so as to form a gain etalon that resonates at the central wavelength $\lambda_0$. This is represented by the Resonate Periodic Gain etalon feature (RPG feature) depicted in FIG. 1 by the reference numeral 2. As will be appreciated by those skilled in the art, as well as the RPG feature at the central wavelength $\lambda_0$ other RPG features spaced by the free spectral range (FSR) of the gain etalon may be present. Typically, the FSR range of a gain etalon is 30 nm and so RPG features would appear at wavelength $\lambda=\lambda_0\pm m30$ where m is an integer value. As a result there exist three RPG features within the reflectivity bandwidth $\Delta R$ of the distributed Bragg reflector (DBR) of FIG. 1, one at 950 nm, 980 nm and 1010 nm.

Figure 1:
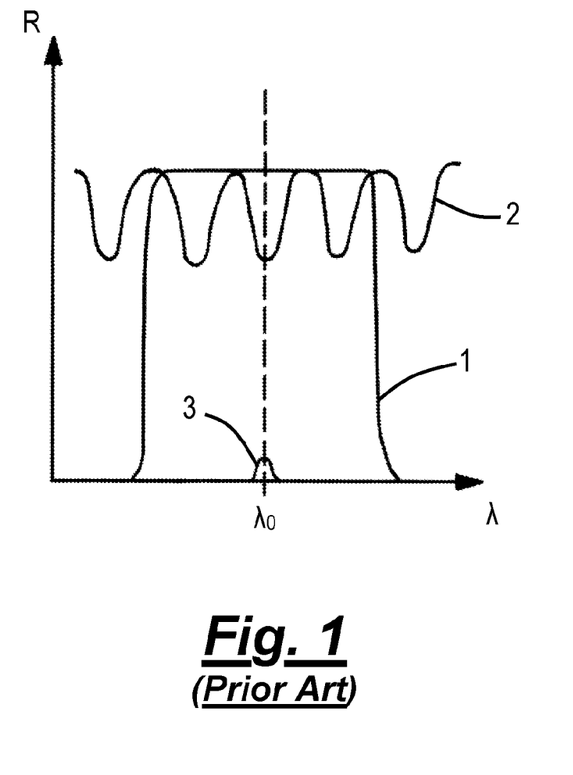
FIG. 1 presents a schematic representation of reflectivity and gain profiles for the components of a saturable Bragg reflector (SBR) mode-locked semiconductor disc lasers (SDL) as known in the art.

The final stage is to introduce one or more quantum well structures designed to emit at the central wavelength $\lambda_0$, as depicted in FIG. 1 by the reference numeral 3. The quantum wells may comprise InGaAs quantum wells equally spaced between the half-wave GaAs structures that allow the SDL to be optically pumped to generate the output at central wavelength $\lambda_0$.

When employing a saturable Bragg reflector (SBR) to mode-lock the SDL it is generally accepted in the art that the reflectivity profile of the distributed Bragg reflector (DBR) of the saturable Bragg reflector (SBR) should be designed so as to match the reflectively profile of the distributed Bragg reflector (DBR) of the SDL 1 i.e. be reflective at the central wavelength $\lambda_0$ and exhibit a similar reflectivity bandwidth $\Delta R$. This is normal practice so as to minimise losses at the central wavelength $\lambda_0$ within the resonator. For similar reasons the other components of the resonator e.g. additional mirrors are also designed to be highly reflective at and around the central wavelength $\lambda_0$.

In practice the inventors have found that the mode locking techniques disclosed in US patent publication number 2004/0190567 do not provide laser systems that reliably mode lock. Laser resonators built to the described designs are found to suffer from noise instabilities. Investigations suggest that these noise instabilities are a result of gain competition between the gain of the RPG feature corresponding to the central wavelength $\lambda_0$ and those of the RPG features at longer wavelengths e.g. 1010 nm. Indeed the inventors have somewhat surprisingly even observed mode-locked output at 1010 nm corresponding to the next longer wavelength, lower energy RPG feature. These instabilities and uncertainties in the operating wavelength of a saturable Bragg reflector (SBR) based mode locked SDL are obviously highly problematic to the development and production of any commercial laser system.

It is therefore an object of an embodiment of the present invention to obviate or at least mitigate the foregoing disadvantages of the saturable Bragg reflector (SBR) based mode locked semiconductor disc lasers (SDL) known in the art.

SUMMARY OF INVENTION

According to a first aspect of the present invention there is provided a laser comprising a resonator terminated by first and second mirrors and folded by a third mirror, the second mirror comprising an intensity saturable mirror suitable for mode locking the resonator field at the predetermined wavelength $\lambda_0$ the third mirror comprising a reflector surmounted by a multilayer semiconductor gain medium including at least one quantum well, the gain medium configured to generate a resonator field at the predetermined wavelength $\lambda_0$ within a first resonant periodic gain etalon (RPG) feature, wherein the reflectivity profiles of the first and second mirrors are offset to a wavelength shorter than the predetermined wavelength $\lambda_0$ and configured to suppress gain within a second resonant periodic gain etalon (RPG) feature at a wavelength longer than the predetermined wavelength $\lambda_0$.

Offsetting the reflectivity profile of the first and or second mirror to wavelength shorter than the predetermined wavelength $\lambda_0$ while suppressing gain within a second resonant periodic gain etalon (RPG) feature at a wavelength longer than the predetermined wavelength $\lambda_0$ provides a means for producing a more reliable mode-locked laser source that exhibits less noise when compared with those systems known in the art.

The reflector may comprise a first distributed Bragg reflector (DBR).

Preferably the intensity saturable mirror comprises a saturable Bragg reflector (SBR) having a second distributed Bragg reflector (DBR) and one or more quantum well layers located within the second distributed Bragg reflector (DBR).

Most preferably the reflectivity profile of the first and or second mirror is offset to a wavelength that is in the range of a half to one free spectral range of the resonant periodic gain etalon (RPG) feature.

The first mirror may be partially reflective and partially transmissive at the predetermined wavelength $\lambda_0$. This allows the first mirror to act as an output coupler for the resonator.

The first mirror preferably has a concave radius of curvature. Optionally the concave radius of curvature of the first mirror is 200 mm.

The resonator may be additionally folded by a fourth mirror, the fourth mirror being located between the second and third mirrors. The fourth mirror preferably has a concave radius of curvature. Optionally the concave radius of curvature of the fourth mirror is 200 mm.

The resonator may be additionally folded by a fifth mirror, the fifth mirror being located between the second and fourth mirrors. The fifth mirror is preferably planar.

The resonator may be additionally folded by a sixth mirror, the sixth mirror being located between the second and fifth mirrors. The sixth mirror preferably has a concave radius of curvature. Optionally the concave radius of curvature of the sixth mirror is 200 mm.

Most preferably one or more adjacent mirrors of the resonator have a mirror spacing of 150 mm.

Optionally the laser comprises a continuous wave (cw) optical field source the output from which is configured to pump the gain medium. The (cw) optical field source may comprise a fibre coupled laser diode system.

Most preferably the laser provides an output field comprising ultra short pulses. The ultra short pulses may have a pulse width in the range of 100 ps to 100 fs.

According to a second aspect of the present invention there is provided a method of mode locking a laser the method comprising providing a resonator terminated by a first mirror and a second mirror comprising an intensity saturable mirror;

folding the resonator with a third mirror, the third mirror comprising a reflector surmounted by a multilayer semiconductor gain medium including at least one quantum well, configuring the gain medium to generate a resonator field at the predetermined wavelength $\lambda_0$ within a first resonant periodic gain etalon (RPG) feature;

offsetting the reflectivity profiles of the first and or second mirrors to a wavelength shorter than the predetermined wavelength $\lambda_0$ and;

configuring the reflectivity profiles of the first and or second mirrors to suppress gain within a second resonant periodic gain etalon (RPG) feature at a wavelength longer than the predetermined wavelength $\lambda_0$.

Most preferably the reflectivity profile of the first and or second mirror is offset to a wavelength that is in the range of a half to one free spectral range of the resonant periodic gain etalon (RPG) feature.

The method of mode locking a laser may further comprise folding the cavity by providing a fourth mirror between the second and third mirrors.

The method of mode locking a laser may further comprise folding the cavity by providing a fifth mirror between the second and fourth mirrors.

The method of mode locking a laser may further comprise folding the cavity by providing a sixth mirror between the second and fifth mirrors.

The method of mode locking a laser may further comprise providing a continuous wave (cw) optical field configured to pump the gain medium.

Embodiments of the second aspect of the invention may comprise features to implement the preferred or optional features of the first aspect of the invention or vice versa.

BRIEF DESCRIPTION OF DRAWINGS

Aspects and advantages of the present invention will become apparent upon reading the following detailed description and upon reference to the following drawings in which.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION

Figure 2:
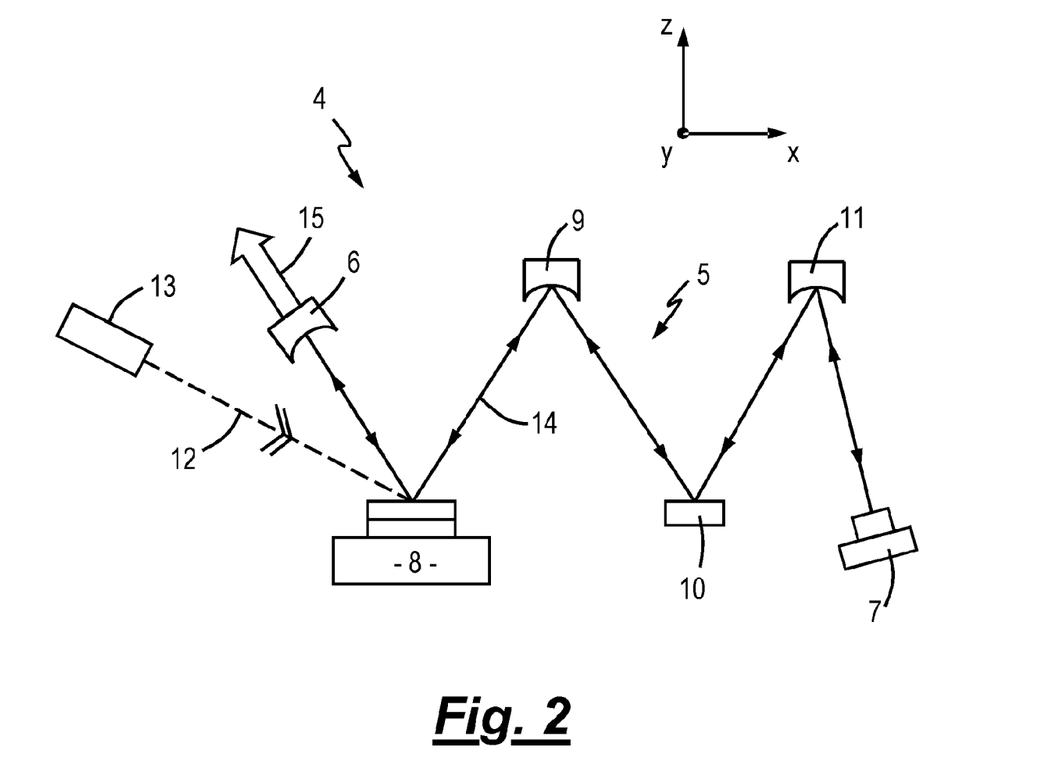
FIG. 2 presents a schematic representation of a mode-locking, semiconductor disk laser (SDL) in accordance with an embodiment of the present invention.

Referring initially to FIG. 2, a schematic representation of a mode-locking, semiconductor disk laser (SDL) 4 in accordance with an embodiment of the present invention is shown. For clarity of understanding axes are provided within this figure. The plane of the cavity referred to below is the plane defined by the x and z axes.

The mode-locking laser 4 can be seen to comprise a laser-resonator 5 formed between a first 6 and a second mirror 7 and includes a multilayer, optically-pumped, semiconductor disk laser (SDL) 8 further details of which are provided below with reference to FIGS. 3 and 4. As can be seen the SDL 8 is arranged to function as a first folding mirror for the resonator 5. Three further folding mirrors 9, 10 and 11 are included within the resonator 5 and so the resonator 5 can be considered to be a four times folded resonator.

The three folding mirrors 9, 10 and 11 are arranged to be highly reflective at the central wavelength $\lambda_0$ of the SDL 8 (for ease of understanding again chosen to be 980 nm) while the first mirror 6 is partially reflective and partially transmissive at this central wavelength and so acts as an output coupler for the resonator 5.

The mirrors 7, 9, 10 and 11 may be mounted within piezo-electric controlled mirror mounts so as to provide a means for fine adjusting the alignment of these components. Furthermore, mirrors 6, 9 and 11 are concave mirrors each having a radius of curvature of 200 mm while the mirrors 7 and 10 and the SDL 8 are substantially planar reflecting elements such that the resonator 5 is optically stable. In the embodiment of FIG. 2 a spacing of 150 mm is provided between each of the adjacent mirrors 6, 8, 9, 10, 11 and 7 within the resonator 5.

A continuous wave (cw) optical pumping field 12 suitable for pumping the SDL 8 is provided by employing a fibre coupled laser diode system 13. In the presently described embodiment the fibre coupled laser diode system 13 is configured to generate a cw optical pumping field 12 at 808 nm. A DILAS® M1F4S22-808 30C-SS2.1 is an example of one such suitable fibre coupled laser diode system 13.

In the presently described embodiment the fibre coupled laser diode system 13 is arranged to pump the SDL 8 at an angle not normal to the SDL 8. It will be appreciated by the skilled reader that the present invention is not so limited and that the fibre coupled laser diode system 13 could provide a pump field 12 that is normal to the SDL 8. The fibre coupled laser diode system 13 may also be arranged to pump the gain medium 19 by pumping through the one of the other mirrors of the resonator 5.

In FIG. 2 the intra cavity resonating field is depicted generally by reference numeral 14 while the ultra short pulsed output field from the laser resonator 5 is depicted generally by reference numeral 15.

Figure 3:
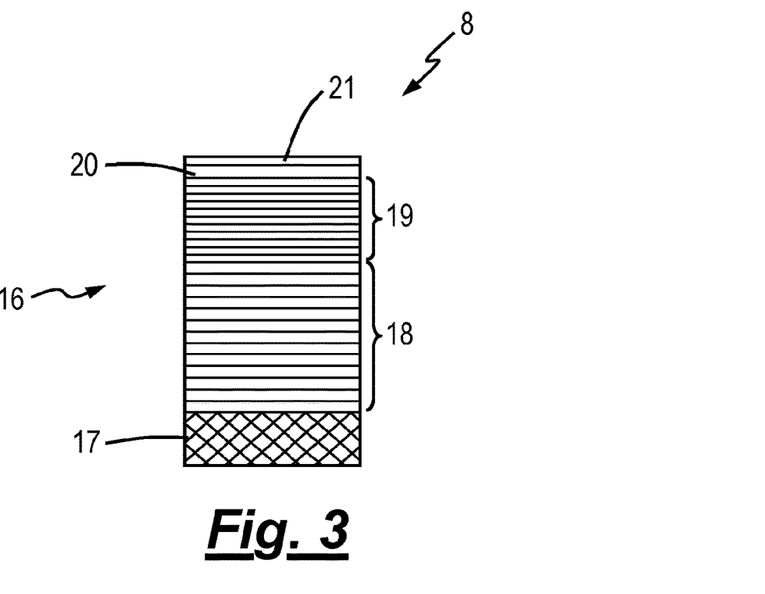
FIG. 3 presents a schematic representation of a semiconductor disk laser (SDL) employed by the laser of FIG. 2.

A schematic representation of the SDL 8 is presented in FIG. 3. The SDL 8 can be seen to comprise a wafer structure 16 that is grown by a metal-organic chemical vapour deposition (MOCVD) technique on a GaAs substrate 17. The deposition of the wafer structure may be achieved by alternative techniques known in the art e.g. molecular beam epitaxy (MBE) deposition techniques. The wafer structure 16 comprises a first distributed Bragg reflector (DBR) 18, a gain medium 19, a carrier confinement potential barrier 20 and an oxidation prevention layer 21.

As is appreciated by those skilled in the art, there are many variations of the wafer structures 16 incorporated within the SDLs and the present invention is not limited to use with any particular DBR 18 or gain medium 19 structures. As discussed above, the gain medium 19 will generally comprise multiple quantum wells equally spaced between half-wave structures that allow the SDL 8 to be optically pumped at a convenient pump wavelength while the DBR 18 generally comprise multiple pairs of quarter-wave layers that exhibit high reflectivities at the desired wavelength for the output field 15.

By way of example only, the presently described embodiments comprise a gain medium 19 comprising InGaAs quantum wells equally spaced between half-wave GaAs structures that allow the SDL 8 to be optically pumped at 808 nm while generating an output at 980 nm. With the above arrangement the gain medium 19 forms a resonant periodic gain etalon (RPG) feature 2 exhibiting a free spectral range (FSR) of the order of 30 nm.

The first DBR region 18 comprises thirty pairs of AlAs—GaAs quarter-wave layers that produce a reflectivity greater than 99.9% centred at 980 nm. The carrier confinement potential barrier 20 comprises a single wavelength-thick $Al_{0.3}Ga_{0.7}As$ layer. The oxidation prevention layer 21 may comprise a thin GaAs cap.

Alternative gain mediums known to those skilled in the art that may alternatively be used include alternative gallium arsenide (GaAs) structures capable of generating output wavelengths between 670 nm and 1300 nm; Indium Phosphide (InP) structures capable of generating output wavelengths between 1350 nm and 1600 nm; and Gallium Antimonide (GaSb) structures capable of generating output wavelengths between 1800 nm and 2700 nm. These gain mediums may be based on quantum wells or quantum dots as known to those skilled in the art.

Figure 4:
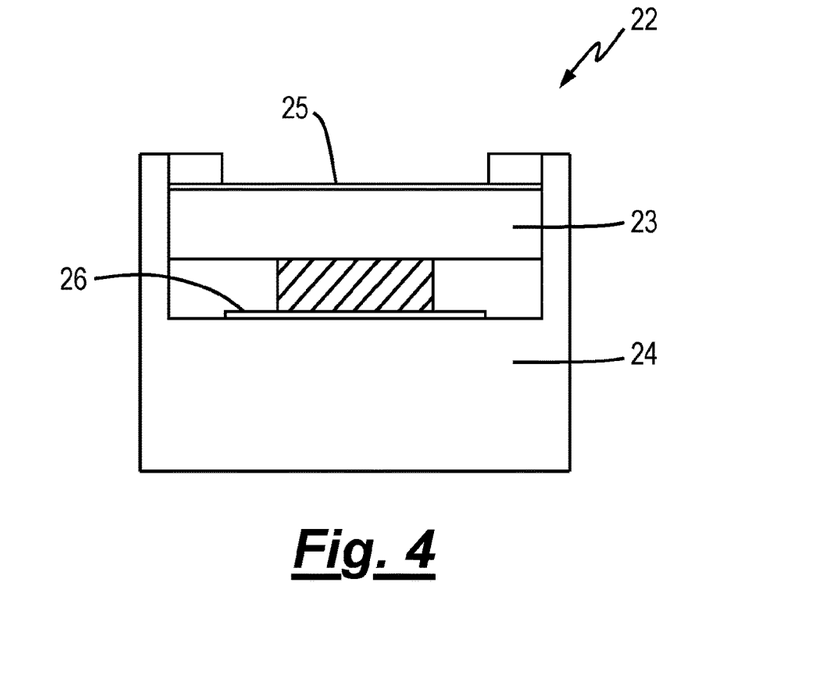
FIG. 4 present a schematic representation of a cooling apparatus employed in conjunction with the SDL of FIG. 3.

FIG. 4 presents further detail of a cooling apparatus 22 employed in order to improve the operating characteristics of the SDL 8. In particular, the cooling apparatus 22 comprises a heat spreader 23 and a standard thermoelectric or water cooler 24. The heat spreader 23 comprises a single diamond crystal that comprises an external, wedged face 25. A high performance anti-reflection coating may be deposited on the surface of the wedged face 25.

The single diamond crystal heat spreader 23 is bonded by optical contacting with the wafer structure 16 so that the gain medium 19 is located between the heat spreader 23 and the first DBR 18. The wafer structure 16 and heat spreader 23 are then fixed on top of a layer of indium foil 26 onto the thermoelectric or water cooler 24.

Mirror 7 is an intensity saturable mirror and may comprise a saturable Bragg reflector (SBR) of the type described in detail within U.S. Pat. No. 5,627,854 and presented schematically in FIG. 5. In the presently described embodiment this component comprises a single quantum well 27 grown within a second distributed Bragg reflector (DBR) 28. The second DBR 28 can be seen to comprise eight pairs of AlAs 29 AlGaAs 30 quarter-wave layers mounted on a GaAs substrate 31 so as to produce a reflectivity greater than 99.9% over a reflectivity bandwidth $\Delta R$ of around 100 nm centred at 950 nm. With the above arrangement the free spectral range of (FSR) of the second distributed Bragg reflector (DBR) 28 is of the order of 300 nm.

Figure 5:
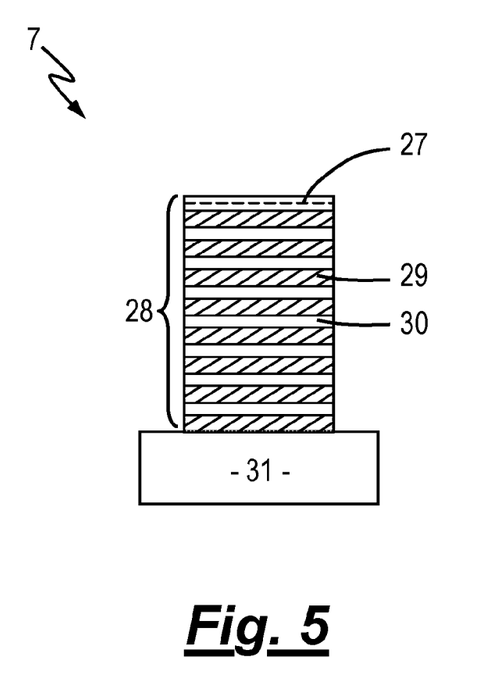
FIG. 5 presents a schematic representation of a saturable Bragg reflector (SBR) employed by the laser of FIG. 2.

As will be appreciated by those skilled in the art, temperature control of the saturable Bragg reflector (SBR) 7 is also necessary. This can be achieved by employing a standard thermoelectric or water cooler in a similar manner to that described above in relation to the SDL 8.

In this configuration the semiconductor laser 4 begins to laser when the gain medium 19 is pumped by the pumping field 12 and the output field 15 is thus generated. Most significant is that the laser is self mode locking such that a single mode, ultra short output field at 980 nm is produced i.e. pulse widths from 100 picoseconds down to a few femtoseconds can be generated. This result is highly repeatable and the mode locking takes place without any requirement for further input from the operator of the laser 4.

Figure 6:
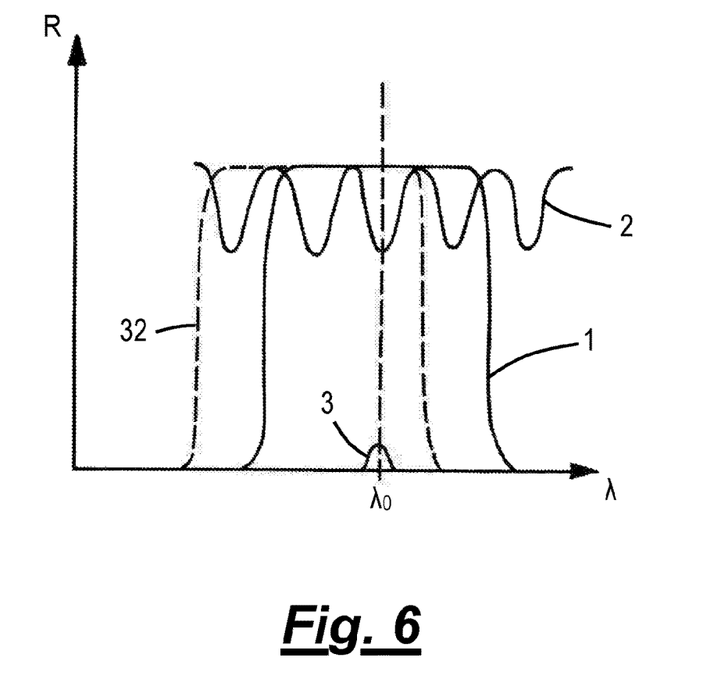
FIG. 6 presents a schematic representation of reflectivity and gain profiles for the mode-locked semiconductor disc lasers (SDL) of FIG. 2.

The reason for the improved characteristics in the output field 15 resides in the fact that a wavelength mismatch has been introduced between the reflectivity profiles 32 of the second distributed Bragg reflector (DBR) 28 contained within the saturable Bragg reflector (SBR) and that of the first DBR 18 of the SDL 8, as depicted schematically in FIG. 6.

As will be appreciated by the skilled reader, the reflectivity profile 32 of the second distributed Bragg reflector (DBR) 28 has been shifted to a shorter wavelength by 30 nm, an amount corresponding to one free spectral range of the resonant periodic gain etalon (RPG) feature 2. The effect of this mismatch is to introduce a controlled loss into the resonator 5. This controlled loss is found to be sufficient to suppress gain at the problematic longer wavelength corresponding to the lower energy RPG feature (i.e. the 1010 nm RPG feature) but not of such a level to prevent self starting mode locking within the RPG feature coinciding with the central wavelength $\lambda_0$.

Furthermore, even with the reflectivity of the second distributed Bragg reflector (DBR) 28 is centred at 950 nm there remains insufficient gain within the shorter wavelength, higher energy, RPG feature (i.e. the 950 nm RPG feature) to disrupt the mode locking of the 980 nm output field 15. The reason for this resides in the fact that there is a tendency within an SDL for the carries to congregate at lower energies, and thus emit light at the corresponding longer wavelengths.

The overall result of reducing the reflectivity within the resonator for the central wavelength $\lambda_0$ by introducing a mismatch between the reflectivity profiles of the second DBR region 28 and that of the first DBR region 18 is that the output field 15 of the laser 4 reliably mode locks at the desired central wavelength $\lambda_0$ of 980 nm with significantly improved noise characteristics.

Sufficient loss on the gain at the problematic longer wavelength corresponding to the lower energy, RPG feature (i.e. the 1010 nm RPG feature) is still found to be present when the reflectivity profile 32 of the second DBR region 28 is shifted to a shorter wavelength by only 15 nm, an amount corresponding to a half of the free spectral range of the resonant periodic gain etalon (RPG) feature 2.

Figure 7:
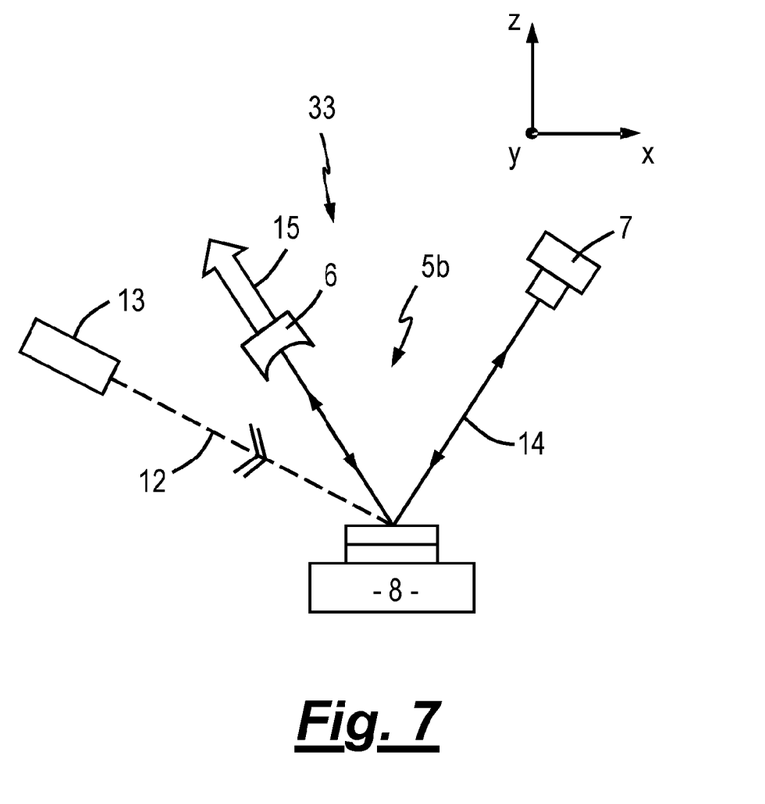
FIG. 7 presents a mode-locking, semiconductor disk laser (SDL) in accordance with an alternative embodiment of the present invention.

FIG. 7 presents a schematic representation of a self mode-locking, semiconductor disk laser (SDL) 33 in accordance with an alternative embodiment of the present invention, similar to the laser 4 presented in FIG. 2. In this embodiment folding mirrors 9, 10, and 11 of the resonator 5 have all been removed such that the resonator 5b can now be considered to be a V-shaped resonator. The laser 33 operates in a similar manner to the laser described above with reference to FIGS. 2 to 6.

In the above embodiments the controlled loss to the gain at the problematic longer wavelength corresponding to the lower energy RPG feature (i.e. the 1010 nm RPG feature) has been introduced by controlled design of the reflectivity profile 32 of the saturable Bragg reflector (SBR) 7. It will however be appreciated that a similar result can be achieved through the modification of the reflectivity profile of one or more of the other mirrors 6, 9, 10, and 11 of the resonator 5.

It will also be appreciated that a number of alternatives may be incorporated into the above described embodiments. For example the structure of the SDL 8 and or the intensity saturable mirror 7 may be varied so as to provide alternative output wavelengths $\lambda_0$ as required by the particular application for which the semiconductor laser is to be employed.

The heat spreader may alternatively comprise materials other than single diamond crystal as long as the material employed exhibits the required heat spreading and optical Kerr lensing properties. Sapphire ($Al_2O_3$) and silicon carbide (SiC) are examples of alternative materials that may be employed to produce the heat spreader.

The above described semiconductor lasers are significantly more stable than those systems known in the art i.e. they reliably mode lock over extended periods of time and exhibit significantly reduced noise when compared to those system known in the art. As a result the inventors have been able to produce a commercially viable intensity saturable mirror based mode locked SDL.

The presently described semiconductor laser systems can be employed to generate pulses having a pulse widths ranging from 100 ps to ~100 fs, at wavelengths between 670 nm and 2700 nm and with power outputs ranging from 100 mW to 5 W.

The present invention describes a mode locking semiconductor disk laser (SDL). The laser comprises a resonator terminated by first and second mirrors and folded by a third mirror. The third mirror comprising a semiconductor disk laser (SDL) suitable for generating a resonator field comprising a predetermined central wavelength $\lambda_0$ while the second mirror comprising an intensity saturable mirror suitable for mode locking the resonator field at the predetermined wavelength. The reflectivity of the of the resonator at the central wavelength $\lambda_0$ is reduced by shifting the reflectivity profiles of the first and or second mirrors to wavelength shorter than the predetermined wavelength so as to suppress gain at wavelengths longer than the central wavelength $\lambda_0$. By mismatching the reflectivity profile of the first and or second mirrors to that of the desired output wavelength provides a stable mode locked laser with significantly reduced noise.

Throughout the specification, unless the context demands otherwise, the terms "comprise" or "include", or variations such as "comprises" or "comprising", "includes" or "including" will be understood to imply the inclusion of a stated integer or group of integers, but not the exclusion of any other integer or group of integers.

Furthermore, reference to any prior art in the description should not be taken as an indication that the prior art forms part of the common general knowledge.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A laser comprising a resonator terminated by first and second mirrors and folded by a third mirror, the third mirror comprising a reflector surmounted by a multilayer semiconductor gain medium including at least one quantum well, the gain medium configured to generate a resonator field at a predetermined wavelength $\lambda_0$ within a first resonant periodic gain etalon (RPG) feature, the second mirror comprising an intensity saturable mirror suitable for mode locking the resonator field at the predetermined wavelength $\lambda_0$, wherein a reflectivity profile of the first and or second mirrors are offset to a wavelength shorter than the predetermined wavelength $\lambda_0$ and configured to reflect at the predetermined wavelength $\lambda_0$ and suppress gain within a second resonant periodic gain etalon (RPG) feature at a wavelength longer than the predetermined wavelength $\lambda_0$.

2. A laser as claimed in claim 1 wherein the reflector comprises a first distributed Bragg reflector (DBR).

3. A laser as claimed in claim 1 wherein the intensity saturable mirror comprises a saturable Bragg reflector (SBR) having a second distributed Bragg reflector (DBR) and one or more quantum well layers located within the second distributed Bragg reflector (DBR).

4. A laser as claimed in claim 1 wherein a central wavelength of the reflectivity profile of the first and or second mirror is offset to a wavelength that is in the range of a half to one free spectral range of the first resonant periodic gain etalon (RPG) feature.

5. A laser as claimed in claim 1 wherein the first mirror is partially reflective and partially transmissive at the predetermined wavelength to act as an output coupler for the resonator.

6. A laser as claimed in claim 5 wherein the first mirror comprises a concave radius of curvature.

7. A laser as claimed in claim 6 wherein the concave radius of curvature of the first mirror is 200 mm.

8. A laser as claimed in claim 1 wherein the resonator is additionally folded by a fourth mirror, the fourth mirror being located between the second and third mirrors.

9. A laser as claimed in claim 8 wherein the fourth mirror comprises a concave radius of curvature.

10. A laser as claimed in claim 9 wherein the concave radius of curvature of the fourth mirror is 200 mm.

11. A laser as claimed in claim 8 wherein the resonator is additionally folded by a fifth mirror, the fifth mirror being located between the second and fourth mirrors.

12. A laser as claimed in claim 11 wherein the fifth mirror is planar.

13. A laser as claimed in claim 11 wherein the resonator is additionally folded by a sixth mirror, the sixth mirror being located between the second and fifth mirrors.

14. A laser as claimed in claim 13 wherein the sixth mirror comprises a concave radius of curvature.

15. A laser as claimed in claim 14 wherein the concave radius of curvature of the sixth minor is 200 mm.

16. A laser as claimed in claim 1 wherein one or more adjacent minors of the resonator have a mirror spacing of 150 mm.

17. A laser as claimed in claim 1 wherein the laser further comprises a continuous wave (cw) optical field source the output from which is configured to pump the gain medium.

18. A laser as claimed in claim 17 wherein the (cw) optical field source comprises a fibre coupled laser diode system.

19. A laser as claimed in claim 1 wherein the laser provides an output field comprising ultra short pulses.

20. A laser as claimed in claim 19 wherein the ultra short pulses may have a pulse width in the range of 100 ps to 100 fs.

21. A method of mode locking a laser the method comprising
providing a resonator terminated by a first mirror and a second mirror, the second mirror comprising an intensity saturable mirror;
folding the resonator with a third mirror, the third mirror comprising a reflector surmounted by a multilayer semiconductor gain medium including at least one quantum well,
configuring the gain medium to generate a resonator field at the predetermined wavelength $\lambda_0$ within a first resonant periodic gain etalon (RPG) feature;
offsetting the reflectivity profiles of the first and or second mirrors to a wavelength shorter than the predetermined wavelength $\lambda_0$ and;
configuring the reflectivity profiles of the first and or second mirrors to reflect at the predetermined wavelength $\lambda_0$ and suppress gain within a second resonant periodic gain etalon (RPG) feature at a wavelength longer than the predetermined wavelength $\lambda_0$.

22. A method of mode locking a laser as claimed in claim 21 wherein a central wavelength of the reflectivity profile of the first and or second mirror is offset to a wavelength that is in the range of a half to one free spectral range of the first resonant periodic gain etalon (RPG) feature.

23. A method of mode locking a laser as claimed in claim 21 wherein the method further comprises folding the cavity by providing a fourth mirror between the second and third mirrors.

24. A method of mode locking a laser as claimed in claim 23 wherein the method further comprises folding the cavity by providing a fifth mirror between the second and fourth mirrors.

25. A method of mode locking a laser as claimed in claim 24 wherein the method further comprises folding the cavity by providing a sixth mirror between the second and fifth mirrors.

26. A method of mode locking a laser as claimed in claim 21 wherein the method further comprises providing a continuous wave (cw) optical field configured to pump the gain medium.

* * * * *